United States Patent [19]

Malhi

[11] Patent Number: 4,621,276

[45] Date of Patent: Nov. 4, 1986

[54] BURIED CONTACTS FOR N AND P CHANNEL DEVICES IN AN SOI-CMOS PROCESS USING A SINGLE N+POLYCRYSTALLINE SILICON LAYER

[75] Inventor: Satwinder D. S. Malhi, Richardson, Tex.

[73] Assignee: Texas Instruments Incorporated, Dallas, Tex.

[21] Appl. No.: 613,679

[22] Filed: May 24, 1984

[51] Int. Cl.[4] .............................................. H01L 27/02
[52] U.S. Cl. ...................................... 357/42; 357/86; 357/71
[58] Field of Search .................... 357/42, 67 S, 71 S, 357/71 P, 86, 59, 23.7

[56] References Cited

U.S. PATENT DOCUMENTS

| 4,276,688 | 7/1981 | Hsu | 357/42 |
| 4,333,099 | 6/1982 | Tanguay | 357/67 S |
| 4,374,700 | 2/1983 | Scott | 357/67 X |
| 4,509,991 | 4/1985 | Taur | 357/42 |

FOREIGN PATENT DOCUMENTS

| 0134964 | 10/1980 | Japan | 357/71 S |
| 0083073 | 7/1981 | Japan | 357/67 S |

Primary Examiner—Andrew J. James
Assistant Examiner—Mark Prenty
Attorney, Agent, or Firm—Robert Groover; James T. Comfort; Melvin Sharp

[57] ABSTRACT

The disclosure relates to a method for realizing a fully functional buried level of interconnect using only a single level of a silicide over N+ polycrystalline silicon, the latter serving as the gate material for both the N channel and P channel devices formed.

12 Claims, 5 Drawing Figures

BURIED CONTACTS FOR N AND P CHANNEL DEVICES IN AN SOI-CMOS PROCESS USING A SINGLE N+POLYCRYSTALLINE SILICON LAYER

BACKGROUND OF THE INVENTION

1. Field of the Invention

This invention relates to silicon on insulator (SOI) CMOS devices and, more specifically, to a process of forming buried contacts for both N and P channel SOI-CMOS devices using a single N+ polycrystalline silicon layer and the device.

2. Description of the Prior Art

In the manufacture of very large scale integrated circuits (VLSI), a high component packing density must be achieved. At VLSI levels, the packing density is a function of the number of levels of interconnect in the device. In addition to the aluminum level, at least one more buried level of interconnect must be achieved. Preferably, this level should have the capability of contacting source, drain and gate of both P and N channel devices in a CMOS device producing process. Further the additional level should be provided with only a minimum number of extra processing steps, since additional processing steps add to processing cost and result in reduced yields.

It is known that a layer of, for example, N+ doped polycrystalline silicon can be used as a gate material for both N channel and P channel CMOS devices. Since the polycrystalline silicon layer is normally N+ doped, it becomes relatively easy to make buried contacts to N channel devices where the source and drain are N+ doped. However, it is not a simple operation to also make such a buried contact to a P-channel device.

The prior art has noted schemes for realizing a buried contact interconnect level. These schemes utilize, for example, N+ and P+ polycrystalline silicon layers covered with a silicide. Such schemes realize fully functional interconnect levels. However, these prior art schemes suffer the drawback that they require both N+ and P+ type polycrystalline silicon layers which inherently require complex processing techniques.

SUMMARY OF THE INVENTION

In accordance with the present invention, there is provided a method for realizing a fully functional buried level of interconnect using only a single level of a silicide over N+ polycrystalline silicon, the latter serving as the gate material for both the N channel and P channel devices formed. In accordance with the process disclosed herein, only a single additional mask is needed to accomplish the above noted capability.

Briefly, silicon islands or substrate regions are oxide isolated in a silicon oxide formed on bulk silicon (SOI) according to standard SOI processing procedures. The islands are selectively doped, one group being P type and the other group N type. Gate oxide is then grown and patterned by etching in the area where buried contacts are to be formed.

The polycrystalline silicon layer is then deposited over the oxide and the region wherefrom the oxide was removed and the polycrystalline silicon is N+ doped. This converts the substrate region from which oxide was removed to N+ type also due to travel of the N+ dopant thereto to provide N+ regions on both sides of the gate oxide in each of the islands. The polycrystalline silicon layer is then masked and etched to expose portions of each of the silicon islands adjacent the N+ regions as well as the N+ doped silicon regions. A mask is then placed over the exposed substrate in the region between the gate oxide and the N+ substrate region of the P channel devices and an N+ implant is carried out which dopes the exposed N-channel source-drain to N+ type and also converts a part of the exposed P-channel source-drain region to N+ type. The mask is then removed and the entire device surface is doped with a P+ type dopant in an amount to provide a P+ region in the area from which the mask was removed, the N+ regions remaining N+ but slightly less so.

A layer of oxide is then formed over the substrate surfaces and etched to provide a side wall oxide along the exposed vertical walls of the N+ polycrystalline silicon. A silicide such as tungsten, platinum or titanium silicide is then formed over the surfaces of the substrates to reduce parasitic resistances such as by depositing titanium over silicon. A wet etch then removes titanium but not silicide. The silicide forms a buried contact between the N+ silicon and the P+ silicon at the source or drain of the P-channel device since the silicide is a conductor for both P+ and N+ regions. The silicide also reduces the sheet resistance of the polycrystalline silicon conductors. Next, a chemical vapor deposition (CVD) oxide is deposited and patterned for contact areas over the entire device except for the gate regions. Aluminum deposition and patterning is then provided whereby the aluminum contacts the deposited silicide over the gate polycrystalline silicon to provide interconnects between the devices.

Primary features of the above described method are a single N+ polycrystalline silicon layer being used to achieve fully functional buried interconnect capability. Buried contact to source, drain and gate electrodes of both N-channel and P-channel devices is provided. In addition, the packing density is enhanced without complicating the processing as in the case of the prior art N+ and P+ polycrystalline silicon approach.

DESCRIPTION OF THE PREFERRED EMBODIMENT

Figure 1A:
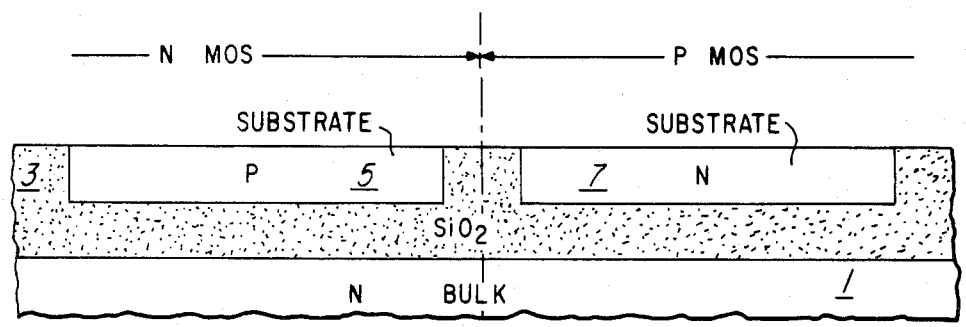
FIGS. 1a through 1e represent schematic diagrams of the processing steps utilized in forming a device in accordance with the present invention.

Referring now to the drawings, there is shown the formation of an SOI-CMOS device utilizing the process steps in accordance with the present invention. The device is produced by providing bulk silicon 1, preferably of N-type, as shown in FIG. 1a. A silicon oxide layer 3 is formed or deposited over the bulk silicon 1 and islands or substrate regions of P-type silicon 5 and N-type silicon 7 are formed in the silicon oxide layer, all in standard manner. While only one P-type island 5 and one N type island 7 are shown, it should be understood that many adjacent P-type and N-type islands 5 and 7 can be formed and processed in the manner to be described hereinbelow on a single chip.

Figure 1B:
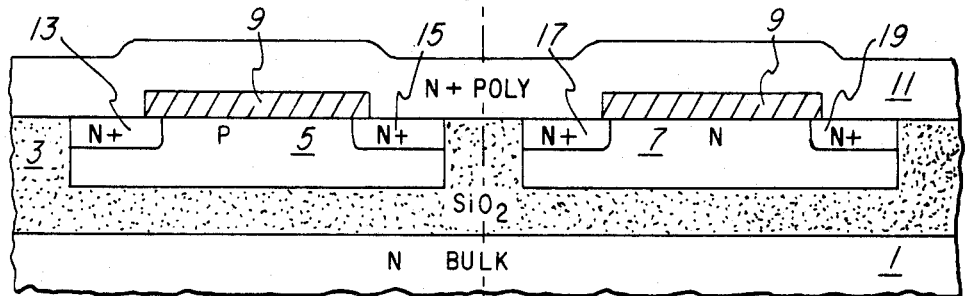

A silicon oxide layer (not shown) is then grown over the entire upper surface of the device shown in FIG. 1a. This oxide is masked and etched to form patterned oxide layer (gate oxide) 9 as shown in FIG. 1b over what will later become the gate regions of each of the devices to be formed. A polycrystalline silicon layer 11 is then formed over the entire upper surface of the devices being formed and the polycrystalline silicon is doped with an N+ type dopant to provide N+ polycrystalline silicon 11 and to dope the regions 5 and 7 where oxide 9 has been removed with the N+ dopant at regions 13, 15, 17 and 19, these later becoming source and drain regions of the devices of which they form a part. It can be seen that the N+ regions 13, 15, 17 and 19 are formed due to the travel of the N+ dopant formed in the polycrystalline silicon region 11, this N+ dopant being blocked from what will later be the channel regions by the gate oxide layer 9.

Figure 1C:
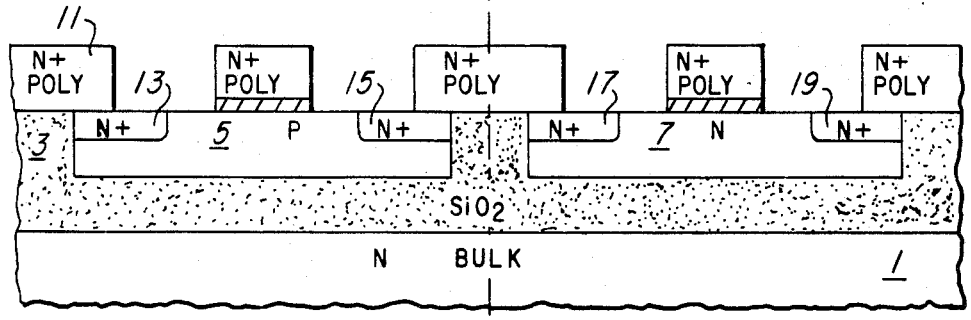
Figure 1D:
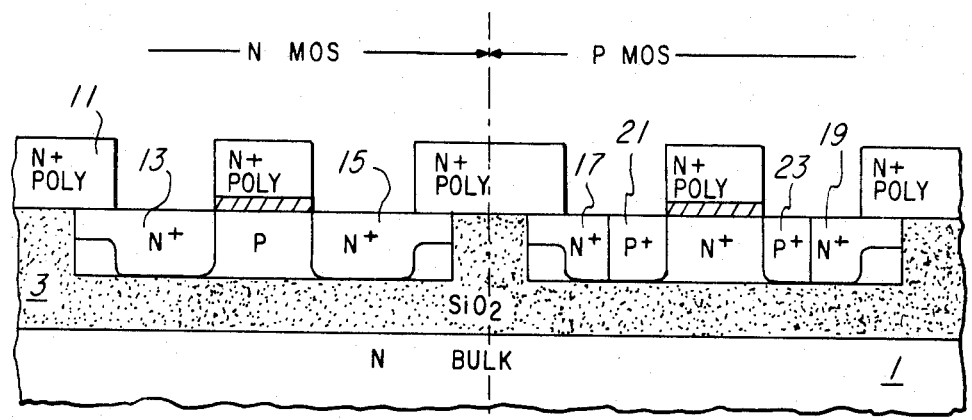

With reference to FIG. 1c, the N+ polycrystalline silicon 11 is selectively removed along with a portion of the oxide layer 9 in order to expose a portion of each of the N+ regions 13, 15, 17 and 19 as well as an adjacent portion of the islands 5 and 7 extending under the gate oxide 9. This is accomplished by appropriate masking and etching in well known manner. A mask is formed over the exposed portion of the region 7 of the P channel devices which has not previously been doped to N+ and which is adjacent the gate oxide (regions 21 and 23 of FIG. 1d). A blanket boron (N+) implant is then carried out to form N+ source and drain regions in all of the exposed regions as shown in FIG. 1d. Then the mask is removed from regions 21 and 23 in FIG. 1d and a P+ dopant is applied to the entire chip surface. The P+ dopant dopes the regions 21 and 23 to P+ as shown in FIG. 1d but is of insufficient amount to dope the N+ regions to less than an N+ dopant level.

Figure 1E:
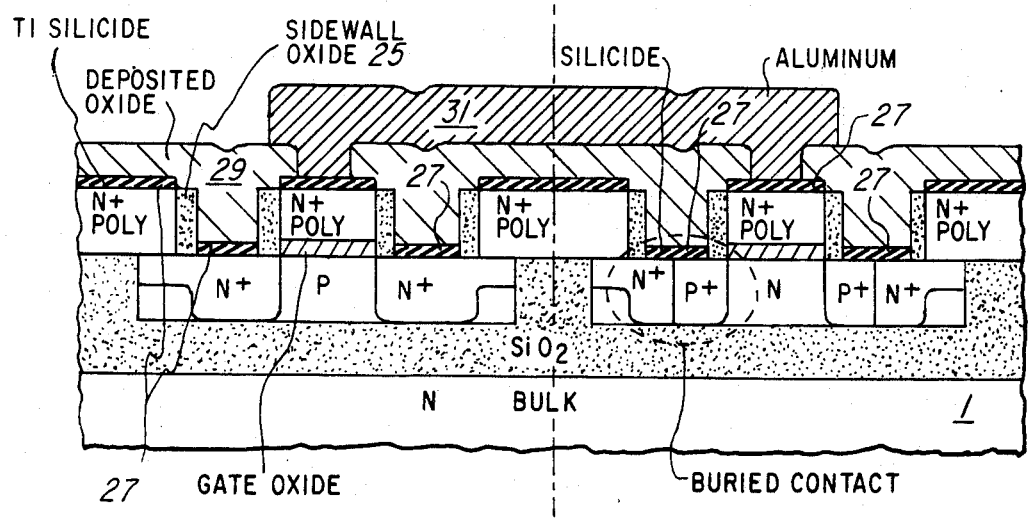

Referring now to FIG. 1e, the entire surface of the chip is oxidized and etched to leave side wall oxide regions 25. Titanium is then deposited on the chip surface and forms a silicide with contacting silicon in known manner to provide silicide layer 27 over the source and drain regions 13, 15, 17, 19, 21 and 23 and over the N+ polycrystalline silicon 11. It should be noted that the silicide 27 also forms a contact between the N+ polycrystalline silicon and the source or drain of the P channel devices as well as between the regions 17-21 and 19-23 which are the source and drain of the P channel devices. The contact between the N+ polycrystalline silicon and the N channel source and drain has also been made. Next, a CVD oxide 29 is deposited and patterned for the contact areas. Aluminum deposition and patterning 31 then takes place to the silicide over the gate oxide and finishes the interconnects to provide the final device as shown in FIG. 2e.

It can be seen that with very simple and a small number of processing steps, there is provided a silicon on insulator CMOS device having buried contacts for both N and P channel devices therein.

Though the invention has been described with respect to a specific preferred embodiment thereof, many variations and modifications will immediately become apparent to thos skilled in the art. It is therefore the intention that the appended claims be interpreted as broadly as possible in view of the prior art to include all such variations and modifications.

What is claimed is:

1. A semiconductor device which comprises:
   (a) an insulating base member,
   (b) spaced semiconductor material regions of opposite conductivity type disposed on said base an electrically isolated from each other,
   (c) one of an N and P channel MOS device formed in one of said regions,
   (d) the other of an N and P channel MOS device formed in the other of said regions,
   (e) one of said devices having a source region and a drain region, each of said source and drain regions having a section of P+ type an adjacent section of N+ type material,
   (f) connecting means electrically interconnected said N+ type and P+ type sections,
   (g) insulating means over said connecting means, and
   (h) a conductor layer over said insulating means and spaced from said connecting means.

2. A semiconductor device as set forth in claim 1 wherein said interconnecting means is a silicide.

3. A semiconductor device as set forth in claim 2 wherein said silicide is taken from the class consisting of tungsten silicide, titanium silicide and platinum silicide.

4. A semiconductor device as set forth in claim 1 wherein said MOS device defined in (e) is a P channel MOS device and wherein said P+ section is adjacent said channel and said N+ section abuts said P+ section and is remote from said channel.

5. A semiconductor device as set forth in claim 2 wherein said MOS device defined in (e) is a P channel MOS device and wherein said P+ section is adjacent said channel and said N+ section abuts said P+ section and is remote from said channel.

6. A semiconductor device as set forth in claim 3 wherein said MOS device defined in (e) is a P channel MOS device and wherein said P+ section is adjacent said channel and said N+ section abuts said P+ section and is remote from said channel.

7. A semiconductor device as set forth in claim 1 further including doped polycrystalline silicon interconnecting predetermined ones of said source and drain regions.

8. A semiconductor device as set forth in claim 2 further including doped polycrystalline silicon interconnecting predetermined ones of said source and drain regions.

9. A semiconductor device as set forth in claim 3 further including doped polycrystalline silicon interconnecting predetermined ones of said source and drain regions.

10. A semiconductor device as set forth in claim 4 further including doped polycrystalline silicon interconnecting predetermined ones of said source and drain regions.

11. A semiconductor device as set forth in claim 5 further including doped polycrystalline silicon interconnecting predetermined ones of said source and drain regions.

12. A semiconductor device as set forth in claim 6 further including doped polycrystalline silicon interconnecting predetermined ones of said source and drain regions.

* * * * *